(12) United States Patent
Shin

(10) Patent No.: US 12,321,093 B2
(45) Date of Patent: Jun. 3, 2025

(54) METHOD FOR OBTAINING AN EXPOSURE DATA AND METHOD FOR MANUFACTURING AN EXPOSURE MASK USING THE SAME

(71) Applicant: Samsung Electronics Co., Ltd., Suwon-si (KR)

(72) Inventor: Soeun Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 17/821,004

(22) Filed: Aug. 19, 2022

(65) Prior Publication Data

US 2023/0152682 A1     May 18, 2023

(30) Foreign Application Priority Data

Nov. 18, 2021   (KR) ........................ 10-2021-0159422

(51) Int. Cl.
    G03F 1/70     (2012.01)
    G03F 1/78     (2012.01)
(52) U.S. Cl.
    CPC . *G03F 1/70* (2013.01); *G03F 1/78* (2013.01)
(58) Field of Classification Search
    CPC ..... G03F 1/70; G03F 1/78; G03F 1/68; G03F 7/705; G03F 1/36; G03F 7/70516
    See application file for complete search history.

(56) References Cited

U.S. PATENT DOCUMENTS 7,343,271 B2   3/2008  Gallatin et al.
7,587,704 B2   9/2009  Ye et al.
           (Continued)

FOREIGN PATENT DOCUMENTS

JP     2011242722 A    12/2011
JP     2018185455 A    11/2018

*Primary Examiner* — Stewart A Fraser
(74) *Attorney, Agent, or Firm* — Myers Bigel, P.A.

(57) ABSTRACT

A method for obtaining exposure data may be provided. MTO (Mask Tape Out) design data for a mask pattern may be received. A mask data preparation operation with respect to the MTO design data may be performed to obtain exposure data. Two-dimensional contours of a plurality of types of test patterns in an exposure mask may be extracted through simulation using a mask process model. First critical dimensions may be measured at measurement points of the contour of each of the plurality of types of test patterns by using a metrology algorithm. The first critical dimensions may be averaged to obtain a first average critical dimension for each of the plurality of types of test patterns. Second critical dimensions in consideration of dispersion in each of the plurality of types of test patterns may be measured using an inverse function of a standard normal distribution, and the second critical dimensions may be averaged to obtain a second average critical dimension for each of the plurality of types of test patterns. A mean to target (MTT) value may be calculated as a difference between the second average critical dimension and a target critical dimension for each of the plurality of types of test patterns. Differences between ones of the MTT values may be calculated. When one or more of the differences between the ones of the MTT values may is outside of a tolerance threshold, the exposure data may be corrected.

20 Claims, 9 Drawing Sheets

(56) References Cited

U.S. PATENT DOCUMENTS

| | | |
|---|---|---|
| 9,671,686 B2 | 6/2017 | Choi et al. |
| 10,223,494 B2 | 3/2019 | Shin et al. |
| 10,866,505 B2 | 12/2020 | Huang et al. |
| 2017/0024510 A1* | 1/2017 | Shin ..................... G06F 30/398 |
| 2021/0132486 A1 | 5/2021 | Melvin et al. |

* cited by examiner

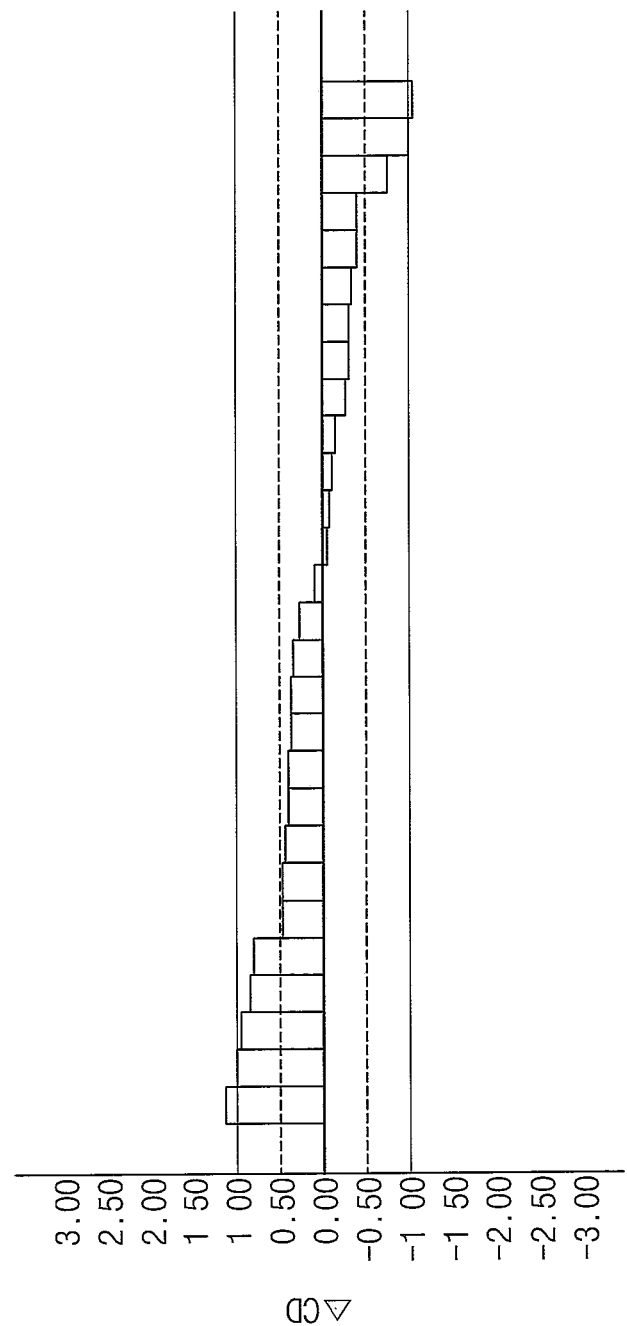

METHOD FOR OBTAINING AN EXPOSURE DATA AND METHOD FOR MANUFACTURING AN EXPOSURE MASK USING THE SAME

CROSS-REFERENCE TO RELATED APPLICATION

This application claims priority under 35 USC § 119 to Korean Patent Application No. 10-2021-0159422, filed on Nov. 18, 2021, in the Korean Intellectual Property Office (KIPO), the contents of which are incorporated by reference herein in their entirety.

BACKGROUND

1. Field

Embodiments of the inventive concept relate to a method for obtaining exposure data for manufacturing an exposure mask used in a photolithography process, and a method for manufacturing the exposure mask using the same.

2. Description of the Related Art

Semiconductor devices may include patterns serving as circuit patterns that are densely and repeatedly arranged. An exposure mask may be used to form the circuit patterns, and the exposure mask may include patterns for forming the circuit patterns. Therefore, the patterns included in the exposure mask may have critical dimensions, such that target circuit patterns may be formed.

SUMMARY

Example embodiments provide a method for obtaining exposure data.

Example embodiments provide a method for manufacturing an exposure mask using the same.

According to example embodiments, there is provided a method for obtaining exposure data. MTO (Mask Tape Out) design data for a mask pattern may be received. A mask data preparation operation may be performed with respect to the MTO design data to obtain exposure data. Two-dimensional contours of a plurality of types of test patterns in an exposure mask may be extracted through simulation using a mask process model. First critical dimensions may be measured at measurement points of the contour for each of the plurality of types of test patterns by using a metrology algorithm. The first critical dimensions may be averaged to obtain a first average critical dimension for each of the plurality of types of test patterns. Second dimensions at the measurement points in consideration of dispersion in each of the plurality of types of test patterns may be measured by using an inverse function of a standard normal distribution, and the second critical dimensions in consideration of the dispersion may be averaged to obtain a second average critical dimension for each of the plurality of types of test patterns. A mean to target (MTT) value may be calculated as a difference between the second average critical dimension and a target critical dimension for each of the plurality of types of test patterns. Differences between ones of the MTT values respectively calculated for each of the plurality of types of test patterns may be calculated. When one or more of the differences between the ones of the MTT values is outside of a tolerance threshold, the exposure data may be corrected.

According to example embodiments, there is provided a method for manufacturing an exposure mask. MTO (Mask Tape Out) design data for a mask pattern may be received. A mask data preparation operation may be performed with respect to the MTO design data may be performed to obtain first exposure data. Two-dimensional contours of a plurality of types of test patterns in an exposure mask may be extracted through simulation using a mask process model. First critical dimensions may be measured at measurement points of the contour for each of the plurality of types of test patterns by using a metrology algorithm. The first critical dimensions may be averaged to obtain a first average critical dimension for each of the plurality of types of test patterns. Second critical dimensions at the measurement points in consideration of dispersion in each of the plurality of types of test patterns may be measured using an inverse function of a standard normal distribution, and the second critical dimensions in consideration of the dispersion may be averaged to obtain a second average critical dimension for each of the plurality of types of test patterns. A mean to target (MTT) value may be calculated as a difference between the second average critical dimension and a target critical dimension for each of the plurality of types of test patterns. Differences between ones of the MTT values respectively calculated for each of the plurality of types of test patterns may be calculated. When the differences between the ones of the MTT values are within a tolerance threshold, the first exposure data may be determined as exposure data. When the one or more of the differences between the MTT values is outside of the tolerance threshold, a corrected first exposure data may be determined as the exposure data. Pixel data may be generated using the exposure data. Electron beam writing may be performed on a mask substrate based on the pixel data. An exposure mask may be formed by performing a development and etching process on the mask substrate.

According to example embodiments, there is provided a method for manufacturing an exposure mask. MTO (Mask Tape Out) design data for a mask pattern may be received. A mask data preparation operation may be performed with respect to the MTO design data to obtain first exposure data. Two-dimensional contours of a plurality of types of test patterns in an exposure mask may be extracted through simulation using a mask process model. First critical dimensions may be measured at measurement points of the contour for each of the plurality of types of test patterns by using a metrology algorithm. The first critical dimensions may be averaged to obtain a first average critical dimension for each of the plurality of types of test patterns. Second critical dimensions at the measurement points in consideration of dispersion in each of the plurality of types of test patterns may be measured using an inverse function of a standard normal distribution, and the second critical dimensions in consideration of the dispersion may be averaged to obtain a second average critical dimension for each of the plurality of types of test patterns. A mean to target (MTT) value may be calculated by a difference between the second critical dimension and a target critical dimension in each of the test patterns. A mean to target (MTT) value may be calculated as a difference between the second average critical dimension and a target critical dimension for each of the plurality of types of test patterns. Differences between ones of the MTT values respectively calculated for each of the plurality of types of test patterns may be calculated. When the differences between ones of the MTT values are within a first tolerance threshold, the first exposure data may be determined as exposure data. When one or more of the differences between the ones of the MTT values is outside of the first tolerance threshold, a corrected first exposure data may be determined as the exposure data. An exposure mask may be formed using the exposure data. An exposure process may be performed using the exposure mask to form actual exposure patterns. Third critical dimensions may be measured at the measurement points for each of the plurality of types of test patterns in the actual exposure patterns by using a metrology algorithm, and the third critical dimensions may be averaged to obtain a third average critical dimension for each of the plurality of types of test patterns. A second MTT value may be calculated as a difference between the third average critical dimension and a target critical dimension for each of the plurality of types of test patterns. When differences between ones of the second MTT values are within a second tolerance threshold, the exposure data maintained. When one or more of the differences between the ones of the second MTT values is outside of the second tolerance threshold, the mask data preparation may be corrected.

According to example embodiments, critical dimensions (i.e., line widths) in consideration of the dispersion based on positions may be measured at predetermined points of a contour obtained by simulation. A second critical dimension that is an average critical dimension of the critical dimensions may be calculated. As the second critical dimension may be accurately measured at the contour generated by simulation before performing an exposure process, exposure data may be corrected such that a difference between the second critical dimensions of various test patterns in the exposure mask pattern may be decreased. Therefore, a targeted exposure mask may be manufactured by using the corrected exposure data.

BRIEF DESCRIPTION OF THE DRAWINGS

Example embodiments will be more clearly understood from the following detailed description taken in conjunction with the accompanying drawings. FIGS. 1 to 7 represent non-limiting, example embodiments as described herein.

FIG. 1 is a flow chart illustrating a method for obtaining exposure data in accordance with example embodiments;

FIG. 3 illustrates a shape by first exposure data and a contour by simulation in accordance with example embodiments;

FIG. 4 is a flowchart of a method for manufacturing an exposure mask in accordance with example embodiments;

FIG. 5 is a flowchart illustrating a method for manufacturing an exposure mask in accordance with example embodiments;

FIG. 6 is a graph illustrating a difference between a second critical dimension in each of the types of the patterns and a critical dimension of an actual exposure pattern in accordance with example embodiments; and FIG. 7 is a graph illustrating a difference between a first critical dimension for each of the types of the patterns and a critical dimension of an actual exposure pattern in accordance with example embodiments.

DESCRIPTION OF EMBODIMENTS

Figure 1:
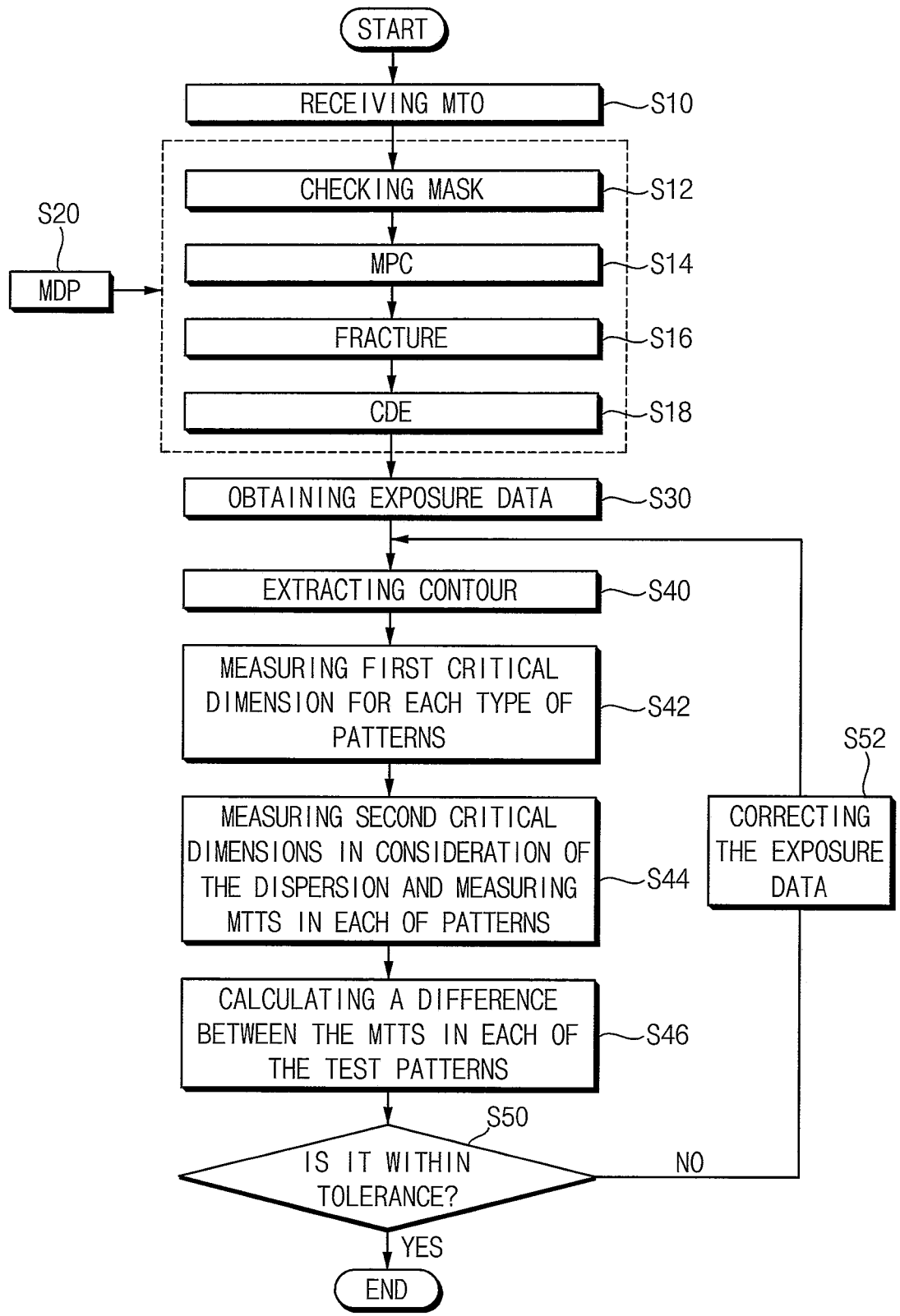

Various example embodiments will be described more fully hereinafter with reference to the accompanying drawings, in which some example embodiments are shown. The present disclosure may, however, be embodied in many different forms and should not be construed as limited to the embodiments set forth herein. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a flow chart illustrating a method for obtaining exposure data in accordance with some example embodiments.

To obtain corrected exposure data, a critical dimension may be measured at a contour obtained by simulation, and exposure data may be corrected using the critical dimension. The critical dimension may be, e.g., a line width of a line pattern or a diameter of a contact. But this is just an example of a critical dimension. Other critical dimensions may be defined in accordance with various example embodiments.

Referring to FIG. 1, first, MTO (Mask Tape Out) design data obtained by Optical Proximity Correction (OPC) may be received (S10).

In general, the MTO may be mask design data on which the OPC operation has been completed. The MTO design data may have a graphic data format used in electronic design automation (EDA) software or the like. For example, the MTO design data may have a data format, such as Graphic Data System II (GDS2) and Open Artwork System Interchange Standard (OASIS), etc.

As patterns may be fine, an optical proximity effect (OPE) due to an influence between adjacent patterns may occur during the exposure process. Briefly, the OPC operation may be to correct a pattern layout on an exposure mask so as to decrease the OPE.

After receiving the MTO design data, a mask data preparation (MDP) operation may be performed (S20).

The MDP operation may include, for example, mask check (S12), mask process correction (MPC, S14), format conversion referred to as fracture (S16), and contrast enhancement by dose modulation (CED, S18), etc.

The MPC included in the MDP operation may be a process for overcoming (decreasing) a difference caused by process characteristics using a mask process model in manufacturing the exposure mask based on MTO design data. In a broader sense, the MPC may be a process for correcting numerous systematic errors that may occur anywhere during the manufacturing the exposure mask and forming an actual exposure pattern on a wafer using the manufactured exposure mask. For example, the systematic errors may occur due to distortions generated in manufacturing processes of the exposure mask, such as electron beam writing, development, etching, and a bake process or the like, and the wafer imaging process in which patterns included in the exposure mask may be transferred to a wafer.

The MPC may be performed, e.g., by correcting a mask process model, adjusting a critical dimension, adjusting a pattern arrangement precision, or the like. Further, the MPC may be performed to complement the OPC. For example, when a density of patterns may be high, errors of the critical dimensions may still occur after performing the OPC. Therefore, the errors of the critical dimensions may be decreased by performing the MPC.

The format conversion (i.e., fracture) in the MDP operation may be a process of dividing the MTO design data according to each area and changing into a format for an electron beam exposure apparatus. The fracture step may include data manipulation, such as scaling, data sizing, data rotation, pattern reflection, color inversion, etc.

The CED in the MDP operation may be to optimize the dose according to each position of the pattern to improve a dose margin. That is, in the CED, the dose may be raised or lowered according to each position of the pattern to improve the dose margin. For example, in applying the CED technique, the dose may be increased at a center portion of patterns having a size smaller than a specific size, or the dose may be increased at the entirety of the patterns having a size smaller than the specific size. Also, the dose may be increased at an edge portion of patterns having a size greater than the specific size.

First exposure data may be primarily obtained by the MDP operation (S30). In example embodiments, the first exposure data may include a text file related to a series of instructions, such as arrangement information of multiple mask files, a reference dose, and/or an exposure speed or method.

Meanwhile, when an exposure mask is manufactured based on the first exposure data and an exposure process is performed using an exposure mask to form various types of actual exposure patterns, the actual exposure patterns may have target critical dimensions (i.e., target line widths). In addition, a difference between critical dimensions of various types of the actual exposure patterns may be small. That is, a dispersion (or distribution) of the critical dimension may be small. When the difference between the critical dimensions of each type of the actual exposure patterns is out of a tolerance (i.e., allowable error), it may be determined as an error of the first exposure data. Therefore, the first exposure data may be corrected so that the difference between the critical dimensions is within a tolerance threshold. If the first exposure data is corrected according to the tolerance threshold in the actual exposure pattern formed using an actual exposure mask after manufacturing the exposure mask, consumption of the exposure mask may increase.

In example embodiments, the error of the first exposure data may be determined and confirmed before performing the exposure process using the actual exposure mask. The determining of the error of the first exposure data may include obtaining exposure patterns by simulation and measuring the exposure patterns. Hereinafter, an exposure pattern obtained by an exposure process using the actual exposure mask after manufacturing the exposure mask is referred to as an actual exposure pattern. The actual exposure pattern may be a photoresist pattern.

First, the determining of the error of the first exposure data may include a process of extracting two-dimensional contours of various types of patterns included in the exposure mask by simulation using a mask process model (S40), a measuring of the critical dimensions at measurement points of the contours of each of the types of patterns (S42, S44), and comparing the critical dimensions of the contours for each of the types of patterns (S46).

Hereinafter, the process of extracting the two-dimensional contours, measuring of the critical dimensions of the contours, and comparing the critical dimensions of the contours for each of the types of patterns is described in more detail.

The exposure mask may include patterns (hereinafter, circuit patterns) for forming circuits included in the semiconductor device and various types of test patterns for checking of critical dimensions of the circuit patterns. Each of the test patterns may have a different shape, different arrangement, different density, or the like. The two-dimensional contours may be extracted from each type of the test patterns. For example, the test patterns may include first patterns disposed in a scribe lane and second patterns disposed in a chip region. In addition, third patterns for correcting the dose of an electron beam may be further included. The first pattern may represent various patterns included in the circuit pattern. The first pattern may be provided to confirm the critical dimensions of the circuit patterns. The second pattern may represent patterns formed in the chip region. For example, the second pattern may be provided to confirm the critical dimensions of the circuit patterns densely arranged in the chip region. The third pattern may be provided to confirm the critical dimensions according to the dose of the electron beam.

Figure 2A:
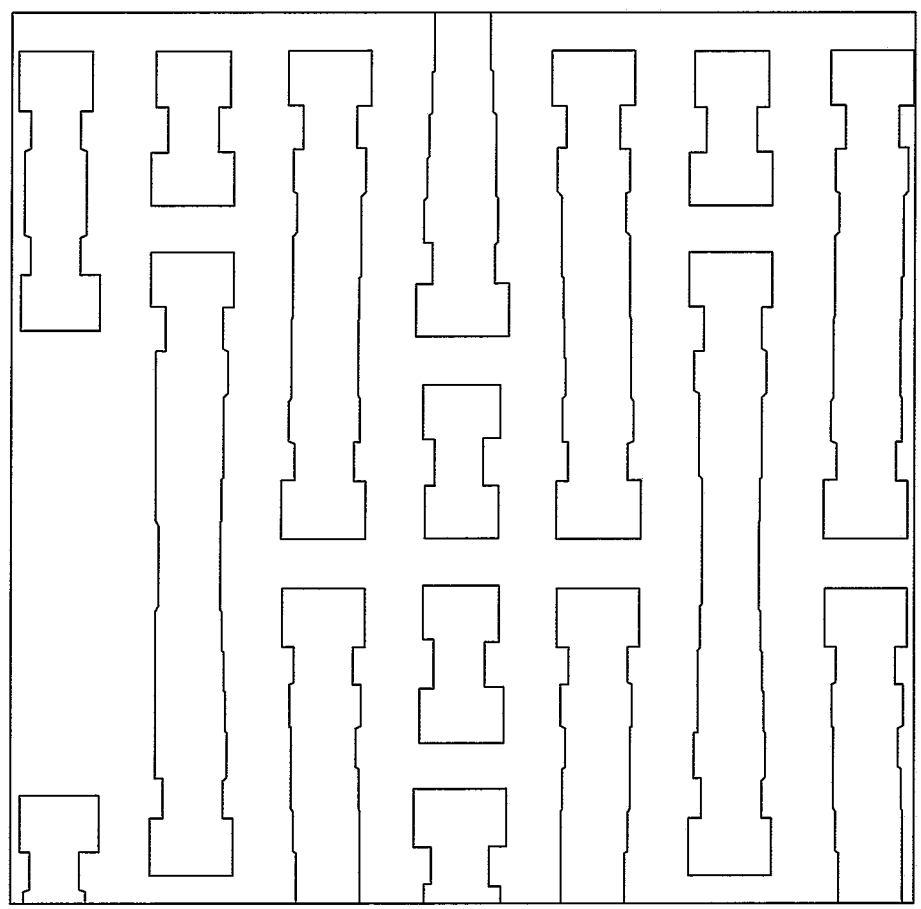
FIGS. 2A to 2C are plan views illustrating examples of the test patterns in the semiconductor device in accordance with example embodiments.
Figure 2B:
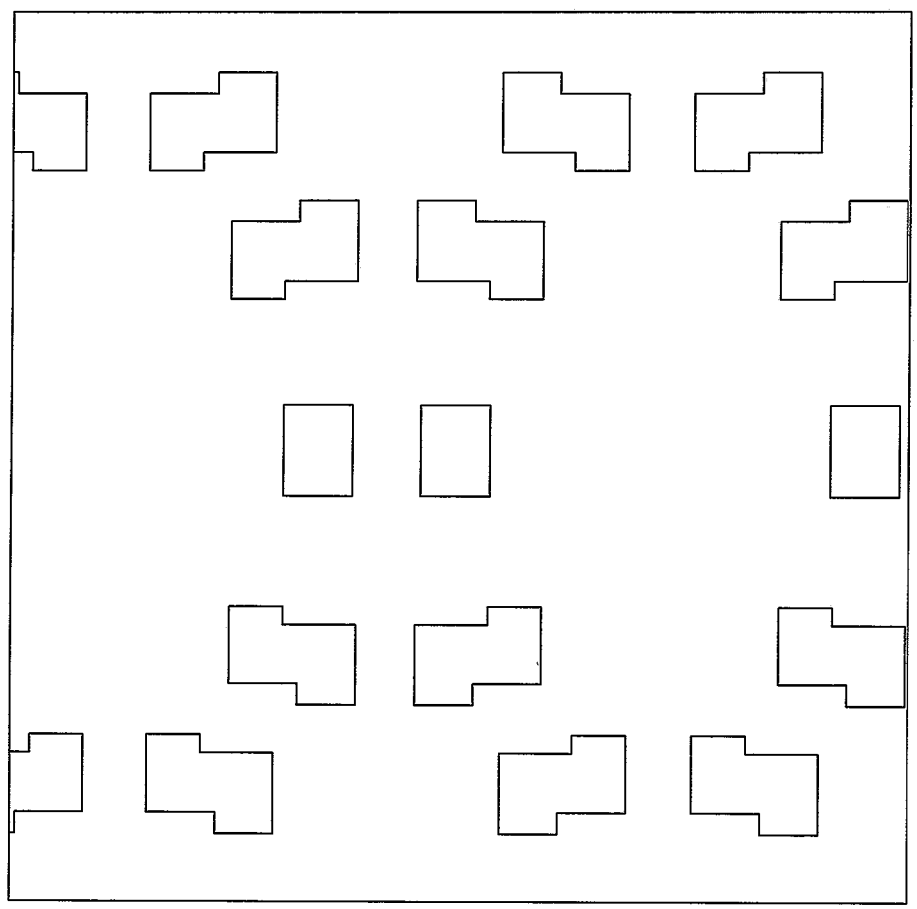
Figure 2C:
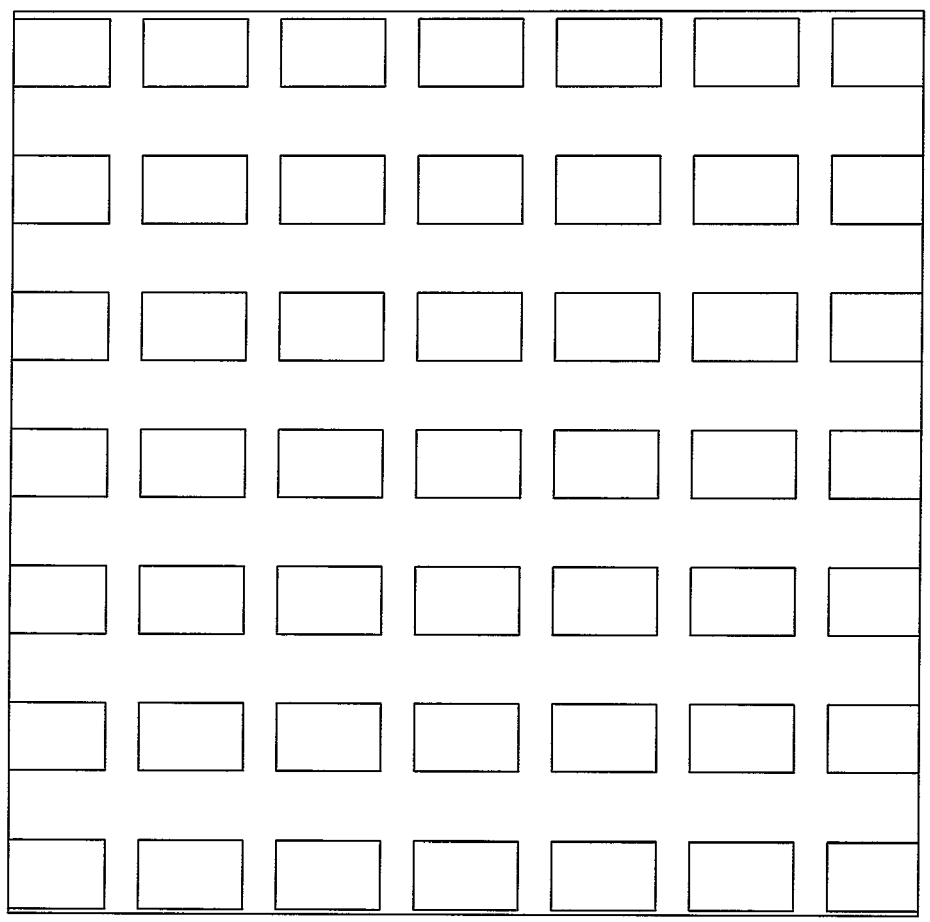

FIGS. 2A to 2C are plan views illustrating examples of the test patterns in the semiconductor device.

Referring to FIG. 2A, the test patterns may include line patterns spaced apart from each other. The test patterns may include alternately and repeatedly arranged line patterns and spaces. Referring to FIG. 2B, the test patterns may include contacts. Referring to FIG. 2C, the test patterns may include regularly arranged contacts.

For example, the test pattern shown in FIG. 2A may be the first pattern, the test pattern shown in FIG. 2B may be the second pattern, and the test pattern shown in FIG. 2C may be the third pattern. However, each of the first to third patterns is not limited to the illustrated ones, and each of the first to third patterns may be provided as a various pattern having different shapes, different arrangements, and different densities in accordance with different example embodiments.

Contours may be extracted from at least two patterns among the first to third patterns. Each of the first to third patterns may have a target critical dimension. In addition, when the first to third patterns have the same target critical dimension, the first to third patterns may not have a difference between critical dimensions. Hereinafter, extraction of contours from the first to third patterns according to example embodiments is described.

First, after obtaining the first exposure data by MDP, two-dimensional contours may be extracted from the first to third patterns by simulation using the mask process model.

That is, for obtaining the two-dimensional contours, an exposure mask may be manufactured based on a mask data on which the MPC is performed, and exposure patterns formed using the exposure mask may be obtained by the simulation. The mask process model may be an empirical model based on experimental data, and may be a model reflecting a trend of a manufacturing process of the exposure mask.

In example embodiments, a region of interest (ROI) may be predetermined in the test patterns in the exposure mask. If the critical dimensions are measured in all regions of the test pattern without predetermining the ROI in advance, it may take an excessive amount of time to determine errors. Thus, a turn around time (TAT) of manufacturing the exposure mask may increase. Accordingly, the ROI may be predetermined, and then the errors may only be determined in the ROI. Thus, the time required for measurement of the critical dimension may be decreased. For example, the ROI may include a hot-spot region in which a patterning margin is weak, corner portions of each of patterns, or regions in which errors frequently occur. When the ROI is predetermined, the critical dimension may only be measured in the ROI.

Figure 3:
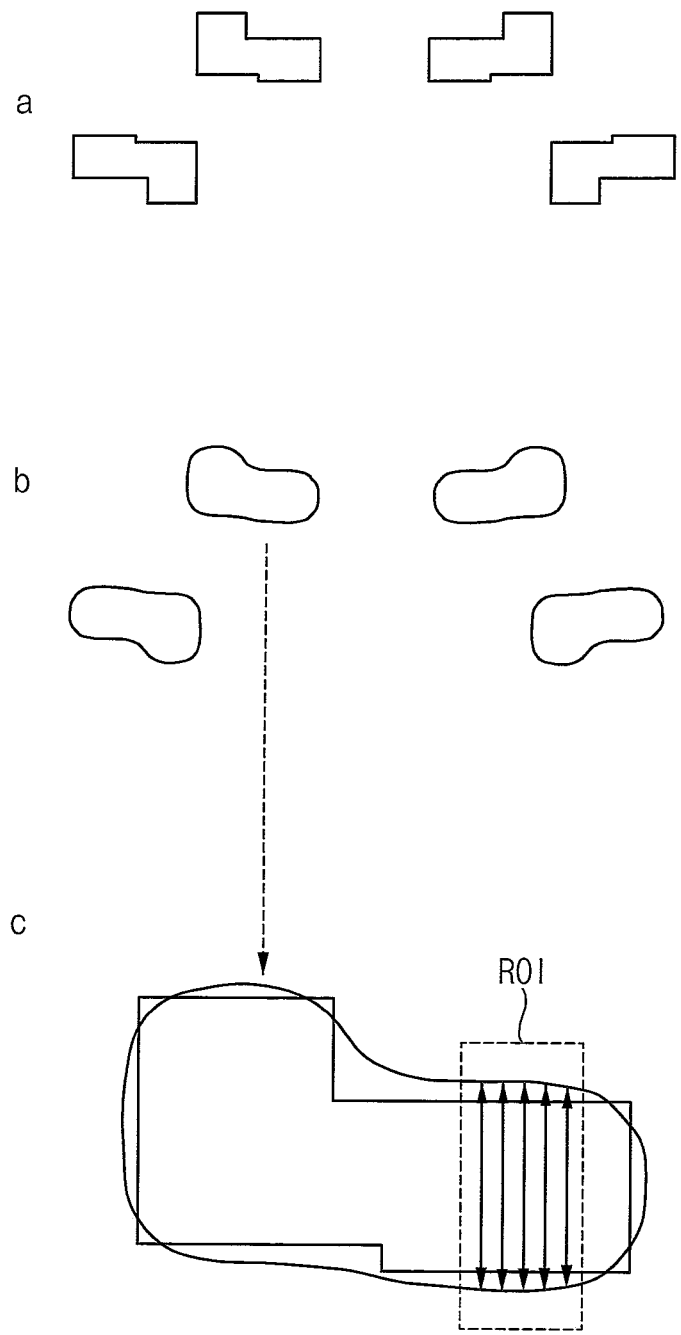

FIG. 3 illustrates a shape by first exposure data and a contour by simulation in accordance with example embodiments.

Referring to FIG. 3, (a) shows the shape by the first exposure data. The first exposure data may be represented by, e.g., as a two-dimensional function Ψ0(x0, y0).

(b) shows the contour by the simulation. The contour may be extracted through the simulation using a mask process model with respect to exposure data on which the MPC performed. Data corresponding to the two-dimensional contour may be represented by a two-dimensional function Ψ(x, y) like the MTO design data above.

(c) shows only one enlarged contour. As shown in (c), a region of interest (ROI) for measuring the CD and a measurement point for measuring the critical dimension (i.e., line width) of the contour may be indicated.

Hereinafter, a method for measuring the critical dimension of the contour, according to example embodiments, is described in more detail.

A measurement of the critical dimension of the contour may be performed by using a metrology algorithm. In example embodiments, the metrology algorithm may be the same metrology algorithm used in measuring the critical dimension in an actual exposure pattern. Particularly, to increase the consistency with the results in the actual exposure pattern formed by actual patterning, the number of measurement points, a method of the measurement, and the metrology algorithm for measuring the critical dimension of the contour may be all matched to the number of measurement points, a method of the measurement, and the metrology algorithm for measuring the critical dimension of the actual exposure pattern.

To measure the critical dimension, the measurement points may be preset in the region of interest (ROI) for measuring the critical dimension in the contour. For example, portions indicated by arrows in (c) of FIG. 3 may be the measurement points, respectively. The region of interest may be preset as a portion in which MPC is inaccurately performed by experience. The region of interest and the measurement points may be the same as a region of interest and measurement points for measuring the critical dimension of the actual exposure pattern, respectively.

The critical dimensions at the measurement points within the region of interest may be measured using the metrology algorithm. The critical dimensions measured at the measurement points may have a Gaussian distribution. A first critical dimension for each of the types of patterns may be calculated by averaging the critical dimensions. (S42) That is, the first critical dimension may be measured in each of the first pattern and the second pattern and the third pattern.

Meanwhile, because the first critical dimension is an average of critical dimensions measured at measurement points, a dispersion of critical dimensions may not be considered in the first critical dimension. Therefore, when the dispersion of the critical dimensions is increased, the first critical dimension may not be representative of an exact critical dimension. Accordingly, to increase an accuracy of the first critical dimension, a function for a local distribution of the patterns may be added. The function may be an inverse function of a standard normal distribution.

To measure the critical dimension while taking into consideration the dispersion at each of measurement points, first, a probability value (i.e., the dispersion) at the measurement points may be randomly generated using a Gaussian random number generator. The first critical dimension and the dispersion using process monitoring information may be combined to calculate a normal inverse cumulative distribution function, and thus a critical dimension in consideration of the dispersion may be measured.

$$x=f(x)^{-1}(p,\text{mean},\text{sigma})$$

x: a critical dimension in consideration of dispersion
f(x): Gaussian normal distribution function
p: Gaussian random number
Mean: first critical dimension
Sigma: dispersion using process monitoring information The dispersion using the process monitoring information may be a dispersion obtained by the critical dimensions continuously measured in the actual exposure pattern for a certain period. The dispersion using the process monitoring information may be the dispersion obtained empirically based on actual data.

By the above method, the critical dimension in consideration of dispersion may provide a more accurate measurement at each of the measurement points. A second critical dimension in consideration of dispersion may be calculated by averaging the critical dimensions in consideration of dispersion. (S44) That is, the second critical dimension may be measured in each of the first pattern, the second pattern, and the third pattern.

A mean to target (MTT) value may be calculated as a difference between the second critical dimension and the target critical dimension. The MTT may be a value indicating how close the measured value is to the target value. The MTT value may be calculated for each of the first pattern, the second pattern, and the third pattern. In some embodiments, the second critical dimension may be equal to the target critical dimension, and thus the MTT may be close to zero. For example, the MTT may be 2 nm or less.

Thereafter, the difference between the MTTs determined for each of types of patterns may be calculated. (S46) For example, the difference between the MTT of the first pattern and the MTT of the second pattern may be calculated. For example, the difference between the MTT of the second pattern and the MTT of the third pattern may be calculated.

When the difference between the MTTs of different types of patterns is little, a difference between centers of the critical dimensions of types of patterns may be little. Accordingly, it may be determined that uniformity of the critical dimension between types of patterns may be high. For example, the difference in MTTs of types of patterns may be 2 nm or less.

It may be determined whether the difference between the MTTs is within a tolerance threshold (S50). If the difference between the MTTs is within the tolerance threshold (Yes), it may be determined that the first exposure data is accurate. Thus, the first exposure data may serve as exposure data.

Accordingly, when the difference between the MTTs is within the tolerance threshold, an exposure mask may be manufactured using the first exposure data as the exposure data.

If the difference between the MTTs is outside of the tolerance threshold, the first exposure data may be corrected to generate second exposure data (S52). In this case, the second exposure data may serve as exposure data. The correction of the first exposure data may be performed to decrease the difference between the MTTs. For example, the correction of the first exposure data may include a position of a mask pattern, a correction of dose, a correction of exposure rate, or the like.

After that, the operations for correction of the first exposure data may be repeatedly performed until the difference between the MTTs is within the tolerance threshold.

In example embodiments, additionally, it may be determined whether each of the MTT value of the first pattern, the MTT value of the second pattern, and the MTT value of the third pattern is within the tolerance threshold. It is determined whether each of the MTT values is within the tolerance threshold, and when it is outside of the tolerance threshold, the first exposure data may be corrected.

In example embodiments, the second critical dimension in consideration of the dispersion in each of the types of patterns may be measured, and thus the first exposure data may be corrected such that the difference between the MTTs of the types of patterns may be decreased. Therefore, a more improved mask process model may be implemented. In addition, as an accuracy of the exposure data may be improved, a more precise exposure mask may be manufactured by manufacturing processes of the exposure mask.

Figure 4:
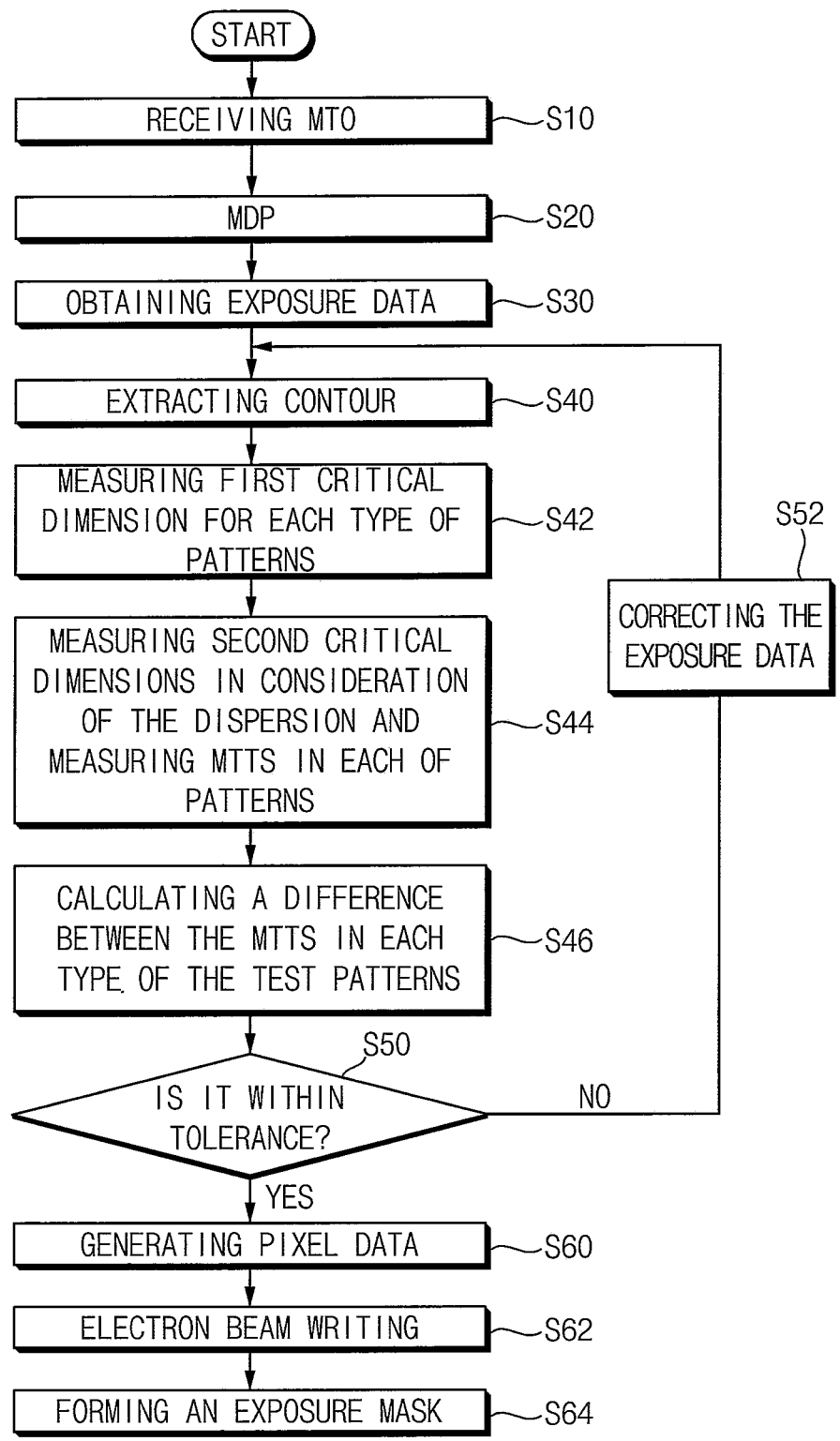

FIG. 4 is a flowchart of a method for manufacturing an exposure mask in accordance with example embodiments.

For convenience of description, content illustrated and described with reference to FIG. 1 is briefly described or omitted.

Referring to FIG. 4, as illustrated with reference to FIG. 1, processes from the operation of receiving MTO design data (S10) to the operation of determining whether a value is out of the tolerance (S50) and the operation of correcting the first exposure data (S52) may be performed. That is, the exposure mask may be manufactured by performing the processes illustrated with reference to FIG. 1, and then performing subsequent processes described below.

In the operation of determining whether the value is outside of the tolerance threshold (S50), if the value is within the tolerance threshold (Yes), pixel data may be generated based on the exposure data (S60). The pixel data may be directly used in an actual exposure process, and the pixel data may include data of a shape to be exposed and data of an assigned dose. Here, the data of the shape may be bit-map data in which vector data is converted through rasterization or the like.

Meanwhile, the exposure data may be used to generate the pixel data after being stored in a storage unit through a data copy. Also, the pixel data may be stored in the storage unit through data copy.

After generating the pixel data, an exposure (that is, electron beam writing) process may be performed using the pixel data (S62). Here, the electron beam writing process means irradiating an electron beam to a mask substrate (that is, a mask original substrate) based on the pixel data.

The mask original substrate may have a structure in which an opaque thin layer, such as chrome, may be coated on a transparent base layer, such as glass or fused silica. A resist layer having strong etching resistivity may be coated on the chrome before the exposure process, and an electron beam may be irradiated to the resist layer to form predetermined patterns based on the pixel data in the electron beam writing process.

The electron beam writing process may be performed by, e.g., variable shape beam (VSB) exposure and/or gray exposure using a multi-beam mask writer (MBMW). However, the electron beam writing process may not be limited to the VSB exposure and the gray exposure using MBMW in accordance with different example embodiments.

After the electron beam writing process, a series of processes may be performed to manufacture an exposure mask (S64). The series of processes may include, e.g., development, etching, cleaning, and the like.

In the development process, the resist layer on the mask original substrate may react sensitively or insensitively to a chemical developer.

In the etching process after the development process, surfaces of the chrome in the mask original substrate that are not covered by the resist layer may be exposed to an etching chemical, i.e., etchant. A material of the resist layer may be hardly etched in the etching process, and thus the material may have a lower etch rate compared to the etch rate of the chrome positioned thereunder with respect to the etchant. The etching process may be performed by wet etching or dry etching using plasma chemical agents. After removing an exposed portion of the chrome, remaining portions of resist may be removed. Thereafter, a cleaning process may be performed.

Meanwhile, the series of processes for forming the exposure mask may include a measurement process, a defect inspection process, and/or a defect repair process. In addition, a pellicle application process may be performed after confirming no contaminating particles or chemical stains through final cleaning and inspection. Here, the pellicle application process may be a process of attaching a pellicle to a mask for protecting from subsequent contamination of the mask during delivery of the mask and a useful life of the mask.

In a method of manufacturing of the exposure mask, the two-dimensional contour may be extracted using the mask process model, and the first critical dimension may be measured in each of the types of patterns from the two-dimensional contour. Thereafter, the second critical dimension in consideration of the dispersion may be measured. Therefore, the second critical dimension of each of the types of patterns may be more accurately measured, and the difference between the MTTs of types of patterns may be more accurately calculated. The exposure data may be corrected to decrease the difference between the MTTs. Therefore, the processes for manufacturing the exposure mask may be performed using more accurate exposure data, and thus a more precise exposure mask may be manufactured.

Figure 5:
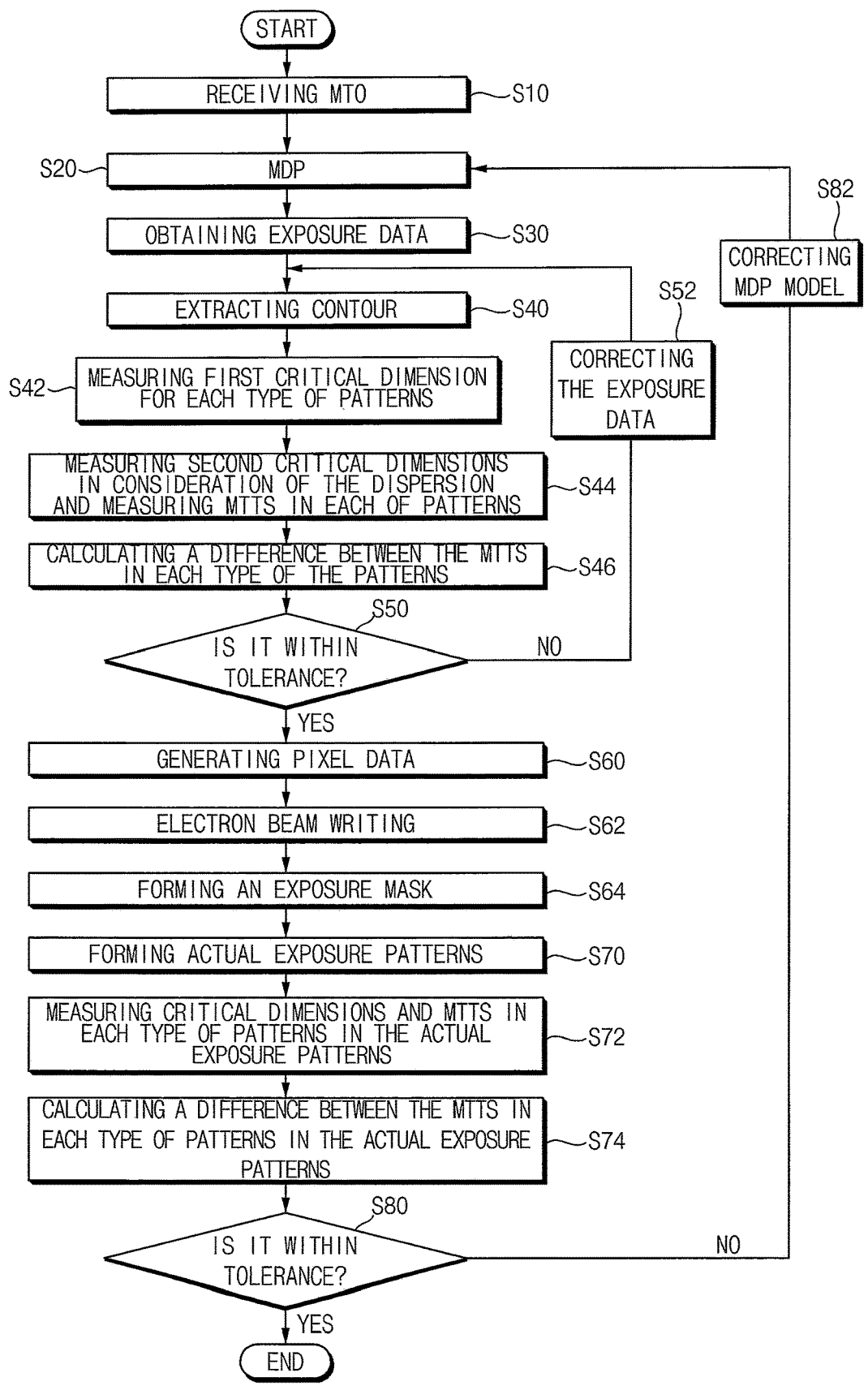

FIG. 5 is a flowchart illustrating a method for manufacturing an exposure mask in accordance with example embodiments.

For convenience of description, content illustrated and described with reference to FIGS. 1 and 4 is briefly described or omitted.

Referring to FIG. 5, as illustrated with reference to FIG. 1, processes from the operation of receiving MTO design data (S10) to the operation of determining whether a value is outside of the tolerance threshold (S50) and the operation of correcting the exposure data (S52) may be performed. In addition, as illustrated with reference to FIG. 3, processes from the operation of the pixel data generation (S60), the operation of electron beam writing (S62), and operation of manufacturing the exposure mask (S64) may be performed.

That is, after performing the same processes illustrated with reference to FIG. 1, the processes illustrated with reference to FIG. 4 may be performed, and subsequent processes described below may be performed to manufacture a semiconductor device.

An exposure mask may be formed by performing the process operations (S10) to (S64) illustrated with reference to FIGS. 1 and 4. Semiconductor processes may be performed on a semiconductor substrate, such as a wafer, using the exposure mask to form an actual exposure pattern. (S70)

The semiconductor process using the exposure mask may be a patterning process (i.e., a lithography process), and a target pattern may be formed on the semiconductor substrate or a material layer by the patterning process using the exposure mask.

Meanwhile, to determine defects in the actual exposure pattern, the critical dimension of the actual exposure pattern may be measured. The critical dimensions may be measured for types of test patterns included in the actual exposure patterns.

The region of interest and the measurement points of the actual exposure pattern at which the critical dimension is measured may be the same as the region of interest and the measurement points of the contour. Also, the critical dimension of the actual exposure pattern may be measured using the metrology algorithm the same as the metrology algorithm for measuring the critical dimension of the contour.

The critical dimensions may be measured at the measurement points of each of the types of the actual exposure pattern. A critical dimension of each of the types of patterns may be calculated by averaging the measured critical dimensions. (S72) The critical dimension may be measured at each of the first pattern, the second pattern, and the third pattern of the actual exposure patterns.

A mean to target (MTT) value may be calculated as a difference between the critical dimension of the actual exposure pattern and a target critical dimension. MTT values may be calculated at each of the first pattern, the second pattern, and the third pattern. In some embodiments, the critical dimension is equal to the target critical dimension, and thus the MTT may be close to zero.

Thereafter, the difference between the MTTs in types of patterns may be calculated. (S74) For example, the difference between the MTT of the first pattern and the MTT of the second pattern may be calculated. For example, the difference between the MTT of the second pattern and the MTT of the third pattern may be calculated.

It may be determined whether the difference between MTTs of types of the actual exposure patterns is within a tolerance threshold (S80). If the difference between the MTTs is within the tolerance (Yes), the mask process model of the MPC may not be corrected.

If the difference between the MTTs is outside of the tolerance threshold, the mask process model may be corrected (S82). The correction of the mask process model may be performed by changing recipe data of the mask process model, etc. to decrease the difference between the MTTs.

Accordingly, thereafter, manufacturing processes for the exposure mask may be performed using the corrected mask process model in the same manner.

Thereafter, a semiconductor device may be manufactured by performing the semiconductor manufacturing processes.

Figure 6:
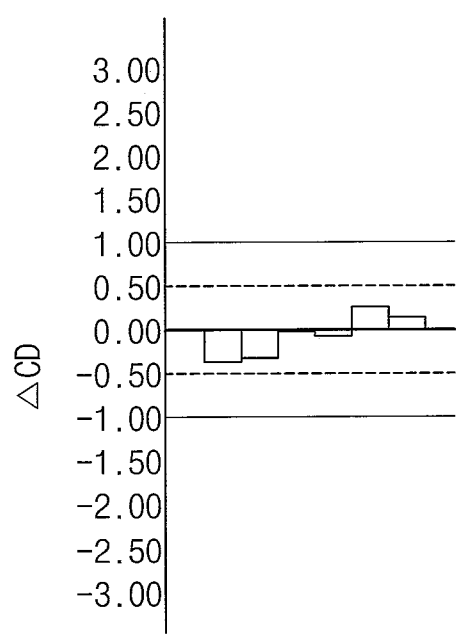

FIG. 6 is a graph illustrating a difference between a second critical dimension in each of types of the patterns and a critical dimension of an actual exposure pattern in accordance with example embodiments. FIG. 7 is a graph illustrating a difference between a first critical dimension for each type of the patterns and a critical dimension of an actual exposure pattern in accordance with example embodiments.

The critical dimension of the actual exposure pattern may be a critical dimension directly measured at the actual exposure pattern formed by performing the exposure process using the exposure mask. In example embodiments, the critical dimension may be measured by SEM (scanning electron microscope).

The first and second critical dimensions may be critical dimensions measured by using a metrology algorithm at the contour obtained by simulation, respectively. The critical dimension of the actual exposure pattern may be measured by using a metrology algorithm the same as the metrology algorithm used to measure the first and second critical dimensions. The second critical dimension may be a critical dimension in consideration of dispersion. The first critical dimension may be a critical dimension without consideration of dispersion.

Referring to FIG. 6, a difference between the second critical dimension and the critical dimension of the actual exposure pattern may be within a range of about ±0.3 nm. That is, an accuracy of critical dimension may be about ±0.3 nm.

Referring to FIG. 7, a difference between the first critical dimension and the critical dimension of the actual exposure pattern may be within a range of about ±1 nm. That is, the accuracy of critical dimension may be about ±1 nm.

As such, the difference between the critical dimension measured at the contour and the critical dimension of the actual exposure pattern may be compared to each other, so that the accuracy of the critical dimension may be confirmed.

The accuracy of the critical dimension calculated from the second critical dimension in consideration of the dispersion may be greater than the accuracy of the critical dimension calculated from the first critical dimension without consideration of the dispersion.

<Comparison of Process Capability>

An actual exposure pattern may be formed using an exposure mask manufactured using a corrected exposure data through the method of FIG. 1, and then a difference between MTTs of types of patterns in the actual exposure pattern may be measured.

An actual exposure pattern may be formed using an exposure mask manufactured using an exposure data after MDP process in the method of FIG. 1. That is, the exposure data may not be corrected. Then, a difference between MTTs of the types of patterns in the actual exposure pattern may be measured.

Table 1 shows probabilities within a tolerance threshold for the MTT difference (i.e., the number of measurement points included in the tolerance/the number of total measurement points×100) while changing the tolerance threshold for the MTT difference.

TABLE 1

| tolerance (nm) | Using corrected exposure data | Using uncorrected exposure data |
|---|---|---|
| ±0.1 | 29.3% | 13.8% |
| ±0.2 | 58.6% | 31.9% |
| ±0.3 | 77.6% | 48.3% |
| ±0.4 | 87.9% | 62.9% |
| ±0.5 | 94.0% | 73.3% |
| ±0.6 | 96.6% | 80.2% |
| ±0.7 | 100.0% | 84.5% |
| ±0.8 | 100.0% | 87.1% |
| ±0.9 | 100.0% | 88.8% |
| ±1.0 | 100.0% | 92.2% |

Referring to Table 1, when the exposure mask is manufactured using the corrected exposure data as in the method according to embodiments of the inventive concept and the tolerance threshold of the difference between MTTs of the types of patterns in the actual exposure pattern is set to about ±0.7 nm or more, 100% of the measured points may be within the tolerance. That is, when the tolerance of the difference between MTTs between the types of patterns is about ±0.7 nm or more, the exposure mask may have no defect.

On the other hand, when the exposure mask is manufactured using the uncorrected exposure data and the tolerance threshold of the difference between MTTs of the types of patterns in the actual exposure pattern is set to about ±1 nm or more, 92.2% of the measurement points may be within the tolerance threshold. That is, even if the tolerance threshold of the difference between MTTs between the types of patterns is about ±1 nm or more, some of the exposure masks may have defects.

As described above, when the exposure mask is manufactured using the corrected exposure data by the method according to embodiments of the inventive concept, defects of the exposure mask may be decreased even if the tolerance of the difference between MTTs between types of patterns is narrowly set. Thus, the number of times for additional exposure mask correction due to the defects in the exposure mask may be decreased.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. Method for obtaining exposure data, comprising:
receiving MTO (Mask Tape Out) design data for a mask pattern;
performing mask data preparation with respect to the MTO design data to obtain exposure data;
extracting two-dimensional contours of a plurality of types of test patterns in an exposure mask through simulation using a mask process model;
measuring first critical dimensions at measurement points of the contour for each of the plurality of types of test patterns by using a metrology algorithm, and averaging the first critical dimensions to obtain a first average critical dimension for each of the plurality of types of test patterns;
measuring second critical dimensions at the measurement points in consideration of dispersion in each of the plurality of types of test patterns using an inverse function of a standard normal distribution, and averaging the second critical dimensions in consideration of the dispersion to obtain a second average critical dimension for each of the plurality of types of test patterns;
calculating a mean to target (MTT) value as a difference between the second average critical dimension and a target critical dimension for each of the plurality of types of test patterns;
calculating differences between ones of the MTT values respectively calculated for each of the plurality of types of test patterns; and,
correcting the exposure data when one or more of the differences between the ones of the MTT values is outside of a tolerance threshold.

2. The method of claim 1, wherein measuring second critical dimensions at the measurement points in consideration of the dispersion in each of the plurality of types of test patterns, comprises:
generating a probability value of the second critical dimensions at the measurement points using a Gaussian random number generator; and
calculating a Normal Inverse Cumulative Distribution Function by combining the corresponding first average critical dimension and a dispersion using process monitoring information, which is expressed by the formula below;

$$x = f(x)^{-1}(p, \text{mean}, \text{sigma})$$

x: the second critical dimension in consideration of dispersion
f(x): Gaussian normal distribution function
p: Gaussian random number
Mean: the first average critical dimension
Sigma: the dispersion using process monitoring information.

3. The method of claim 1, wherein the metrology algorithm is configured for use in measuring a critical dimension of an actual exposure pattern.

4. The method of claim 1, wherein measuring the first critical dimensions at measurement points of the contour for each of the plurality of types of test patterns by using the metrology algorithm comprises:
predetermining a region of interest (ROI) for measuring the first critical dimension of the contour; and
measuring the first critical dimension at each of the measurement points in the region of interest.

5. The method of claim 4, wherein the region of interest (ROI) and the measurement points for measuring the first critical dimensions in the contour are the same as a region of interest (ROI) and measurement points used in measuring critical dimensions of an actual exposure pattern.

6. The method of claim 1, wherein the plurality of types of test patterns include first patterns disposed in a scribe lane, second patterns disposed in a chip region, and a third pattern for correcting a dose of an electron beam.

7. The method of claim 6, wherein calculating differences between ones of the MTT values respectively calculated for each of the plurality of types of test patterns includes calculating a difference between the MTT value of the first pattern and the MTT value of the second pattern.

8. The method of claim 6, wherein calculating differences between ones of the MTT values respectively calculated for each of the plurality of types of test patterns includes calculating a difference between the MTT value of the second pattern and the MTT value of the third pattern.

9. The method of claim 1, wherein performing the mask data preparation includes checking mask, mask process correction (MPC), fracture, and contrast enhancement by dose modulation (CED).

10. The method of claim 9, wherein the mask process correction is performed using the mask process model.

11. A method of manufacturing an exposure mask comprising:
receiving MTO (Mask Tape Out) design data for a mask pattern;

performing mask data preparation with respect to the MTO design data to obtain first exposure data;

extracting two-dimensional contours of a plurality of types of test patterns in an exposure mask through simulation using a mask process model;

measuring first critical dimensions at measurement points of the contour for each of the plurality of types of test patterns by using a metrology algorithm, and averaging the first critical dimensions to obtain a first average critical dimension for each of the plurality of types of test patterns;

measuring second critical dimensions at the measurement points in consideration of dispersion in each of the plurality of types of test patterns using an inverse function of a standard normal distribution, and averaging the second critical dimensions in consideration of the dispersion to obtain a second average critical dimension for each of the plurality of types of test patterns;

calculating a mean to target (MTT) value as a difference between the second average critical dimension and a target critical dimension for each of the plurality of types of test patterns;

calculating differences between ones of the MTT values respectively calculated for each of the plurality of types of test patterns;

determining the first exposure data as exposure data when the differences between the ones of the MTT values are within a tolerance threshold;

determining a corrected first exposure data as the exposure data when one or more of the differences between the ones of the MTT values is outside of the tolerance threshold;

generating pixel data using the exposure data;

performing electron beam writing on a mask substrate based on the pixel data; and forming an exposure mask by performing a development and etching process on the mask substrate.

12. The method of claim 11, wherein measuring second critical dimensions at the measurement points in consideration of the dispersion in each of the plurality of types of test patterns, comprises:

generating a probability value of the second critical dimensions at the measurement points using a Gaussian random number generator; and calculating a Normal Inverse Cumulative Distribution Function by combining the corresponding first average critical dimension and a dispersion using process monitoring information, which is expressed by the formula below $$x = f(x)^{-1}(p, \text{mean}, \text{sigma})$$

x: the second critical dimension in consideration of dispersion
f(x): Gaussian normal distribution function
p: Gaussian random number
Mean: the first average critical dimension
Sigma: the dispersion using process monitoring information.

13. The method of claim 11, wherein the metrology algorithm is configured for use in measuring a critical dimension of an actual exposure pattern.

14. The method of claim 11, wherein measuring the first critical dimensions at the measurement points of the contour for each of the plurality of types of test patterns by using the metrology algorithm comprises:

predetermining a region of interest (ROI) for measuring the first critical dimension of the contour; and measuring the first critical dimension at each of the measurement points in the region of interest.

15. The method of claim 11, wherein the plurality of types of test patterns include first patterns disposed in a scribe lane, second patterns disposed in a chip region, and a third pattern for correcting a dose of an electron beam.

16. A method of manufacturing an exposure mask comprising:

receiving MTO (Mask Tape Out) design data for a mask pattern;

performing mask data preparation with respect to the MTO design data to obtain first exposure data;

extracting two-dimensional contours of a plurality of types of test patterns in an exposure mask through simulation using a mask process model;

measuring first critical dimensions at measurement points of the contour for each of the plurality of types of test patterns by using a metrology algorithm, and averaging the first critical dimensions to obtain a first average critical dimension for each of the plurality of types of test patterns;

measuring second critical dimensions at the measurement points in consideration of dispersion in each of the plurality of types of test patterns using an inverse function of a standard normal distribution, and averaging the second critical dimensions in consideration of the dispersion to obtain a second average critical dimension for each of the plurality of types of test patterns;

calculating a first mean to target (MTT) value as a difference between the second average critical dimension and a target critical dimension for each of the plurality of types test patterns;

calculating differences between ones of the first MTT values respectively calculated for each of the plurality of types of test patterns;

determining the first exposure data as exposure data when the differences between the ones of the MTT values is within a first tolerance threshold;

determining a corrected first exposure data as the exposure data when one or more of the differences between the ones of the MTT values is outside of the first tolerance threshold;

forming an exposure mask using the exposure data;

performing an exposure process using the exposure mask to form actual exposure patterns;

measuring third critical dimensions at the measurement points for each of the plurality of types of test patterns in the actual exposure patterns by using a metrology algorithm, and averaging the third critical dimensions to obtain a third average critical dimension for each of the plurality of types of test patterns;

calculating a second MTT value as a difference between the third average critical dimension and a target critical dimension for each of the plurality of types of test patterns;

maintaining the exposure data when differences between ones of the second MTT values are within a second tolerance threshold; and correcting the mask data preparation when one or more of the differences between the ones of the second MTT values is outside of the second tolerance threshold.

17. The method of claim 16, wherein measuring second critical dimensions at the measurement points in consideration of the dispersion in each of the plurality of types of test patterns, comprises:

generating a probability value of the second critical dimensions at the measurement points using a Gaussian random number generator; and calculating a Normal Inverse Cumulative Distribution Function by combining the corresponding first average critical dimension and a dispersion using process monitoring information, which is expressed by the formula below $$x = f(x)^{-1}(p, \text{mean}, \text{sigma})$$

x: the second critical dimension in consideration of dispersion
f(x): Gaussian normal distribution function
p: Gaussian random number
Mean: the first average critical dimension
Sigma: the dispersion using process monitoring information.

18. The method of claim 16, wherein measuring the first or third critical dimensions at the measurement points of the contour for each of the plurality of types of test patterns by using the metrology algorithm comprises:

predetermining a region of interest (ROI) for measuring the first or third critical dimension of the contour; and measuring the first or third critical dimension at each of the measurement points in the region of interest.

19. The method of claim 16, wherein performing the mask data preparation includes checking mask, mask process correction (MPC), fracture, and contrast enhancement by dose modulation (CED).

20. The method of claim 19, wherein correcting the mask data preparation includes correcting the mask process model in the mask process correction.

\* \* \* \* \*